United States Patent
Takaki

(10) Patent No.: US 11,071,230 B2
(45) Date of Patent: Jul. 20, 2021

(54) HEAT DISSIPATION STRUCTURE OF HEAT GENERATING COMPONENT

(71) Applicant: DENSO TEN Limited, Kobe (JP)

(72) Inventor: Toshiaki Takaki, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 16/835,459

(22) Filed: Mar. 31, 2020

(65) Prior Publication Data

US 2021/0022264 A1 Jan. 21, 2021

(30) Foreign Application Priority Data

Jul. 16, 2019 (JP) .............................. JP2019-131411

(51) Int. Cl.
  *H01L 23/367* (2006.01)
  *H05K 7/20* (2006.01)
  *H01L 23/467* (2006.01)

(52) U.S. Cl.
  CPC ....... *H05K 7/20154* (2013.01); *H01L 23/467* (2013.01); *H05K 7/20445* (2013.01); *H05K 7/20145* (2013.01); *H05K 7/20163* (2013.01); *H05K 7/20972* (2013.01)

(58) Field of Classification Search
  CPC ........... H05K 7/20145; H05K 7/20154; H05K 7/20163; H05K 7/20972
  See application file for complete search history.

(56) References Cited

U.S. PATENT DOCUMENTS

| 5,694,294 A * | 12/1997 | Ohashi ..................... G06F 1/203 |
| | | 361/679.48 |
| 7,561,428 B2 * | 7/2009 | Watanabe .......... H05K 7/20518 |
| | | 165/185 |
| 7,961,471 B2 * | 6/2011 | Odanaka .................... G06F 1/20 |
| | | 361/711 |
| 8,254,128 B2 * | 8/2012 | Yasui ..................... H01L 23/433 |
| | | 361/711 |
| 8,837,140 B2 * | 9/2014 | Zurowski ........... H05K 7/20154 |
| | | 361/679.49 |
| 2006/0011330 A1 * | 1/2006 | Wang .................. H05K 7/20163 |
| | | 165/122 |
| 2012/0044134 A1 | 2/2012 | Nanbu |

FOREIGN PATENT DOCUMENTS

| JP | 2003-222021 A | 8/2003 |
| JP | 2007-123641 A | 5/2007 |
| WO | 2010/125855 A1 | 11/2010 |

\* cited by examiner

*Primary Examiner* — Zachary Pape
(74) *Attorney, Agent, or Firm* — Oliff PLC

(57) ABSTRACT

A heat dissipation structure of a heat generating component includes a heat conductive plate that includes a heat receiving connecting part thermally connected to the heat generating component and a heat dissipation connecting part thermally connected to the chassis and an air cooling fan that generates cooling air for cooling the heat conductive plate. The heat conductive plate further includes a first heat dissipation area from which heat is dissipated by flowing the cooling air along a surface of the plate and a second heat dissipation area that is bent and extends from the first heat dissipation area so as to cross an advancing direction of the cooling air that flows along the surface of the plate at the first heat dissipation area, and from which heat is dissipated by receiving the cooling air that has flown along the surface of the plate at the first heat dissipation area.

10 Claims, 8 Drawing Sheets

HEAT DISSIPATION STRUCTURE OF HEAT GENERATING COMPONENT

BACKGROUND OF THE INVENTION

Field of the Invention

The invention relates to a heat dissipation structure of a heat generating component mounted on a wiring substrate in an electronic equipment.

Description of the Background Art

A structure of a chassis in which heat generated from a heat generating component within the chassis in an electronic equipment is dissipated, a heat sink (heat dissipation plate), and the like, have been known.

For example, a liquid crystal display that includes a heat dissipation mechanism for dissipating heat generated in a semiconductor element and other heat generating components has been disclosed.

However, in recent years, as the semiconductor element in the electronic equipment is highly integrated, highly powered, and the like, power consumption is increased. As a result, a heat generation amount of the semiconductor element is also increased, so that a heat dissipation structure having a superior heat dissipation effect is desired.

SUMMARY OF THE INVENTION

According to one aspect of the invention, a heat dissipation structure of a heat generating component that is mounted on a wiring substrate housed in an interior of a chassis of an electronic equipment includes a heat conductive plate and an air cooling fan. The heat conductive plate arranged in the interior of the chassis includes a heat receiving connecting part thermally connected to the heat generating component and a heat dissipation connecting part thermally connected to the chassis. The air cooling fan generates cooling air for cooling the heat conductive plate in the interior of the chassis. The heat conductive plate further includes (i) a first heat dissipation area from which heat is dissipated by flowing the cooling air generated by the air cooling fan along a surface of the plate and (ii) a second heat dissipation area that is bent and extends from the first heat dissipation area so as to cross an advancing direction of the cooling air that flows along the surface of the plate at the first heat dissipation area, and from which heat is dissipated by receiving the cooling air that has flown along the surface of the plate at the first heat dissipation area.

An object of the invention is to provide a technology pertaining to a heat dissipation structure of a heat generating component mounted on a wiring substrate in an electronic equipment having a superior heat dissipation effect to a conventional component.

These and other objects, features, aspects and advantages of the invention will become more apparent from the following detailed description of the invention when taken in conjunction with the accompanying drawings.

DESCRIPTION OF THE EMBODIMENTS

An embodiment of the invention will be described below with reference to the drawings.

Embodiment 1

<Overall Configuration>

Figure 1:
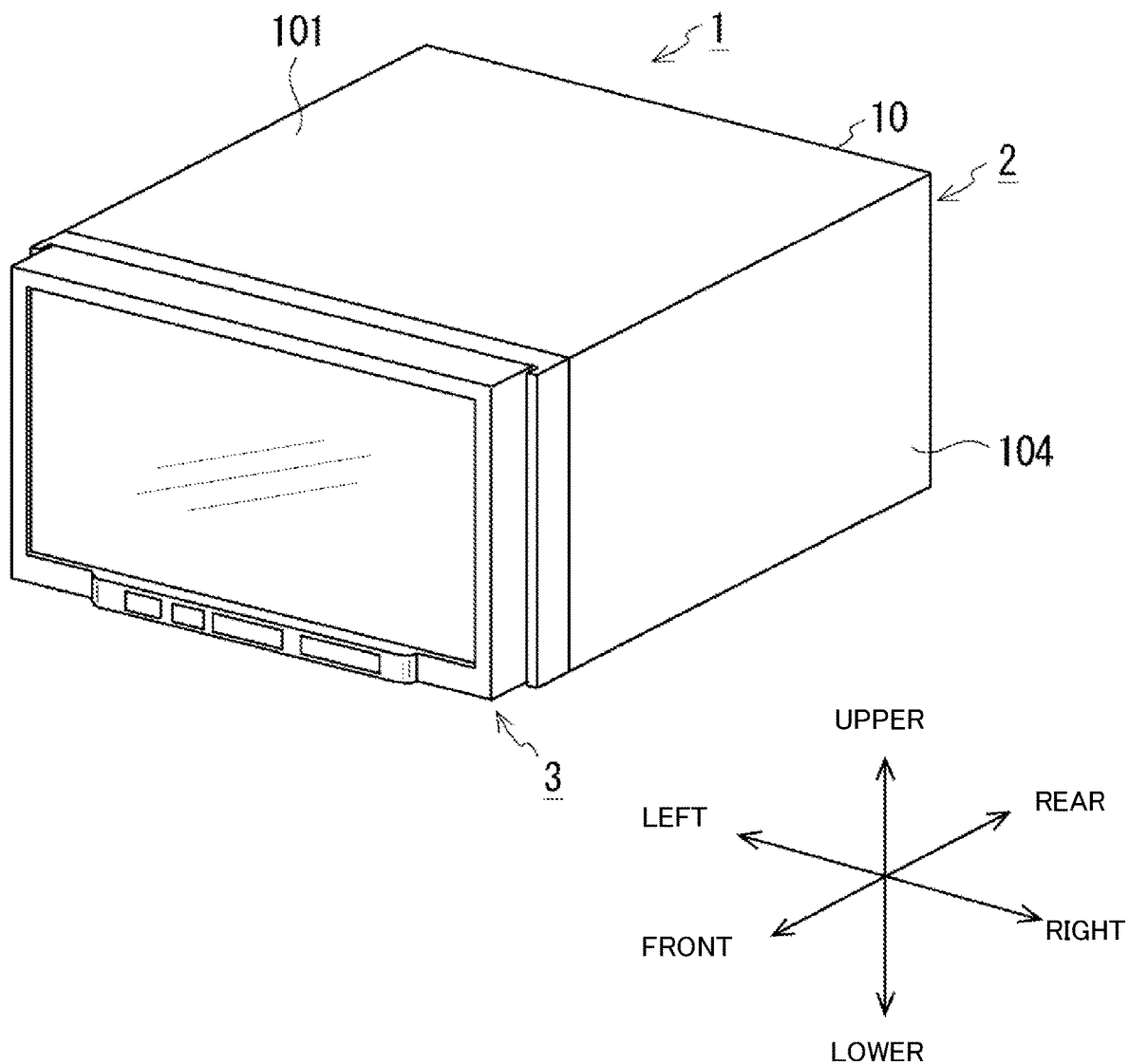
FIG. 1 illustrates an appearance of an electronic equipment according to an embodiment 1.

FIG. 1 illustrates an appearance of an electronic equipment 1 according to an embodiment 1. Here, an example in which a car navigation device as an in-vehicle device is adopted as the electronic equipment 1 will be described. The electronic equipment 1 has a main unit 2 and a display unit 3. The main unit 2 has an external chassis 10 having a substantially rectangular shape that is a metal chassis, and stores various electronic components in a housing space formed in an interior of the external chassis 10. In FIG. 1, each direction of upper, lower, left, right, front, and rear in the external chassis 10 of the main unit 2 is shown. However, these directions merely show a relative positional relationship of each panel constituting the external chassis 10.

Figure 2:
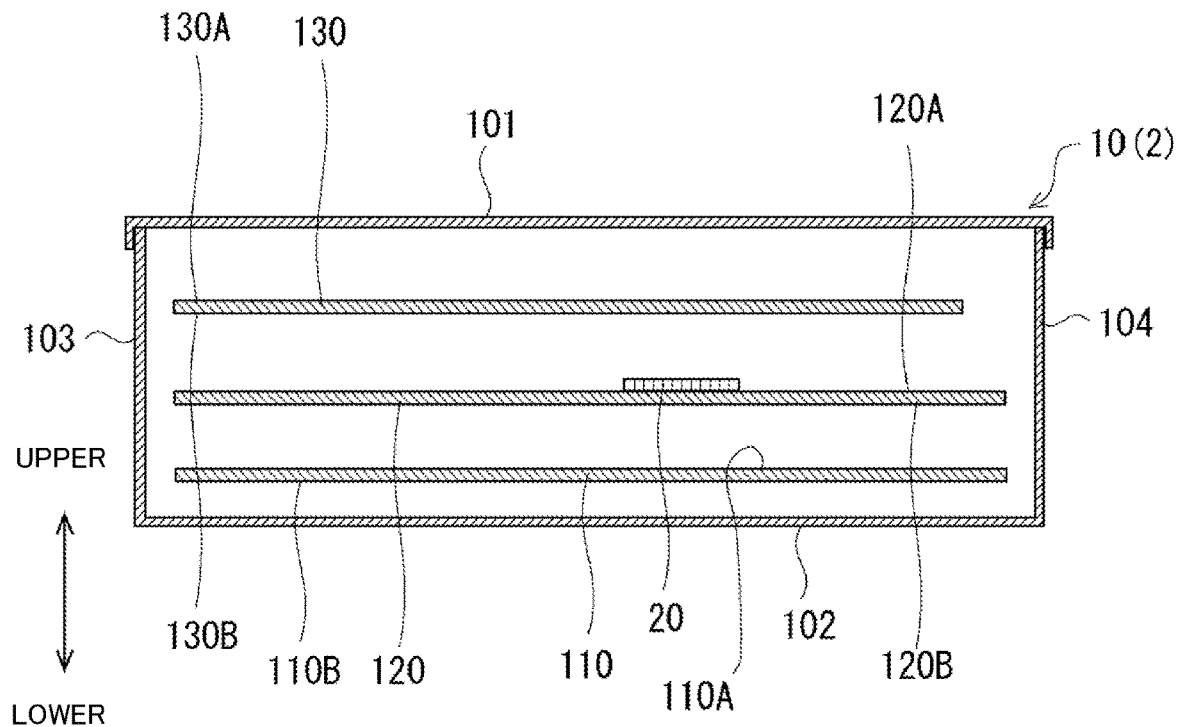
FIG. 2 schematically illustrates an external chassis and wiring substrates that are arranged in an interior of the external chassis according to the embodiment 1.

FIG. 2 schematically illustrates the external chassis 10 and wiring substrates that are arranged in the interior of the external chassis 10. The external chassis 10 has an upper surface panel 101, a bottom surface panel 102, a first side surface panel 103, and a second side surface panel 104. The first side surface panel 103 is arranged opposite to the second side surface panel 104, and upper ends of the first side surface panel 103 and the second side surface panel 104 are respectively connected to both ends of the upper surface panel 101. Lower ends of the first side surface panel 103 and the second side surface panel 104 are respectively connected to both ends of the bottom surface panel 102. The external chassis 10 in this embodiment is formed of a steel electrolytic cold commercial (SECC). However, the external chassis 10 may be formed of other metals, resins, or the like, and a material thereof is not especially limited.

In the interior of the external chassis 10, a wiring substrate on which various electronic components to be included in the main unit 2 are mounted is stored. In an example shown in FIG. 2, a plurality of the wiring substrates is stored in the external chassis 10 in multiple stages, but a number of the wiring substrates to be stored in the external chassis 10 is not especially limited. In the example shown in FIG. 2, a first wiring substrate 110, a second wiring substrate 120, and a third wiring substrate 130 are arranged in a lower stage, a middle stage, and an upper stage in the external chassis 10, respectively. Here, the second wiring substrate 120 and the third wiring substrate 130 are supported by a substrate holder (not shown in FIG. 2) that is an internal metal chassis plate provided in the interior of the external chassis 10. Here, a reference symbol 110A shown in FIG. 2 indicates an upper surface of the first wiring substrate 110, and a reference symbol 110B indicates a lower surface of the first wiring substrate 110. A reference symbol 120A indicates an upper surface of the second wiring substrate 120, and a reference symbol 120B indicates a lower surface of the second wiring substrate 120. A reference symbol 130A indicates an upper surface of the third wiring substrate 130, and a reference symbol 130B indicates a lower surface of the third wiring substrate 130.

Here, an electronic component as a heat generating component that generates heat during operation is mounted on each of the first wiring substrate 110, the second wiring substrate 120, and the third wiring substrate 130. Thus, the main unit 2 in this embodiment includes a heat dissipation structure for dissipating the heat received from the heat generating component. Hereinafter, the heat dissipation structure for dissipating the heat of the electronic component that is mounted on the second wiring substrate 120 in the main unit 2 will be described as an example.

Here, a reference symbol 20 shown in FIG. 2 indicates a heat generating component that is mounted on the upper surface 120A of the second wiring substrate 120. The heat generating component 20 is, for example, a semiconductor element such as a system-on-a-chip (SOC), an integrated circuit (IC), or the like. In the external chassis 10 in this embodiment, a heat sink 30 (refer to FIG. 4, FIG. 5, etc.) that is a heat conductive plate (heat dissipation plate) for receiving heat generated by operation of the heat generating component 20 mounted on the second wiring substrate 120, and dissipating the heat by transmitting the received heat to the external chassis 10 is stored. In FIG. 2, an illustration of the heat sink 30 is omitted.

<Heat Dissipation Structure>

Figure 3:
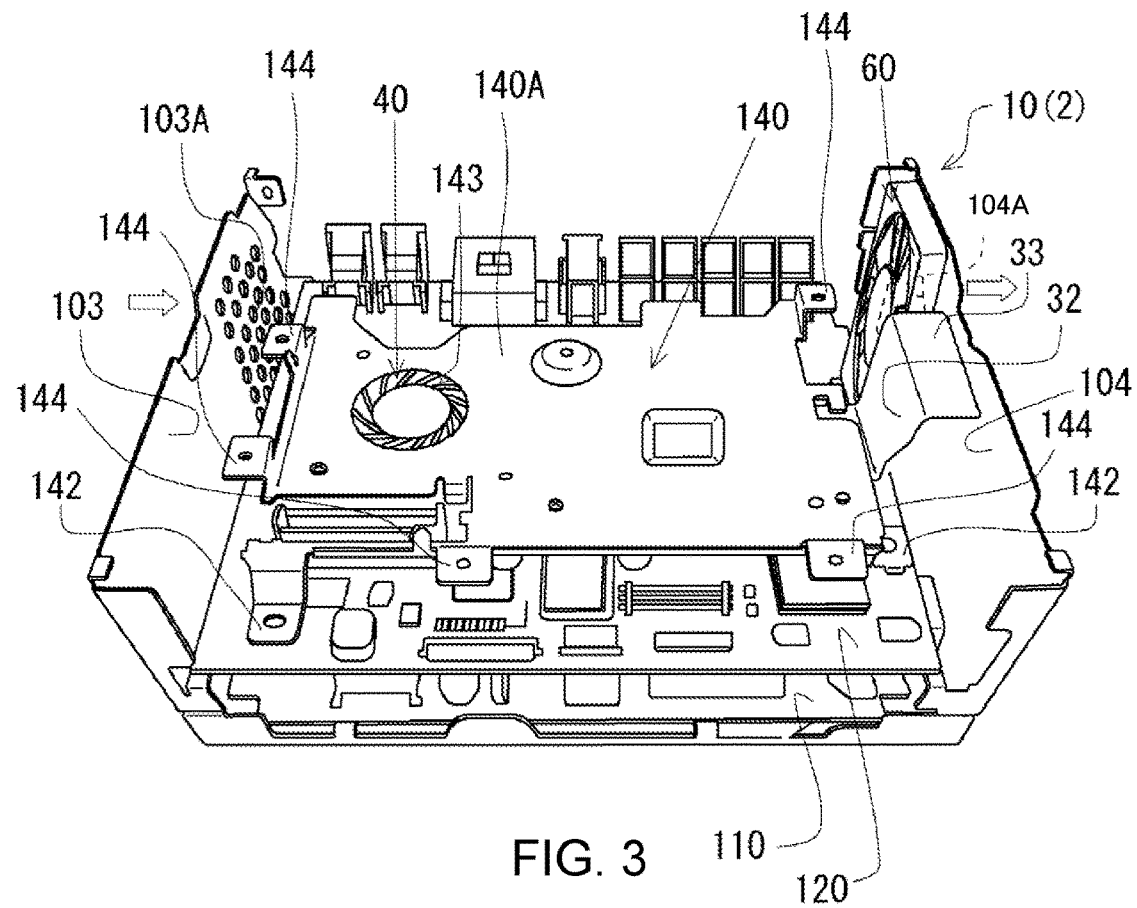
FIG. 3 illustrates a heat dissipation structure of a heat generating component according to the embodiment 1.

FIG. 3 illustrates the heat dissipation structure of the heat generating component 20 according to the embodiment 1. A reference symbol 140 shown in FIG. 3 indicates a substrate holder for supporting the third wiring substrate 130. In this embodiment, the substrate holder 140 is formed of the steel electrolytic cold commercial (SECC). However, the substrate holder 140 may be formed of other metals, resins, or the like, and a material thereof is not especially limited. Here, the substrate holder 140 has fixing parts 144 in proper places that fix the third wiring substrate 130 (refer to FIG. 2) being supported. The third wiring substrate 130 is fixed to the fixing parts 144 of the substrate holder 140, for example, using screws (not shown), or the like. In FIG. 3, the third wiring substrate 130 is removed from the fixing parts 144 of the substrate holder 140. Furthermore, the substrate holder 140 is provided with fixing parts 142 for fixing the substrate holder 140 to the second wiring substrate 120. Here, the fixing parts 142 of the substrate holder 140 are fixed to the second wiring substrate 120, for example, using screws, or the like. Installation positions and numbers, etc., of the fixing parts 144 and 142 in the substrate holder 140 may be freely changed. The substrate holder 140 is arranged above the second wiring substrate 120, and supports the third wiring substrate 130 so as to be interposed between the third wiring substrate 130 and the second wiring substrate 120. A reference symbol 140A shown in FIG. 3 is an upper surface of the substrate holder 140. The upper surface 140A of the substrate holder 140 faces the lower surface 130B of the third wiring substrate 130.

Figure 4:
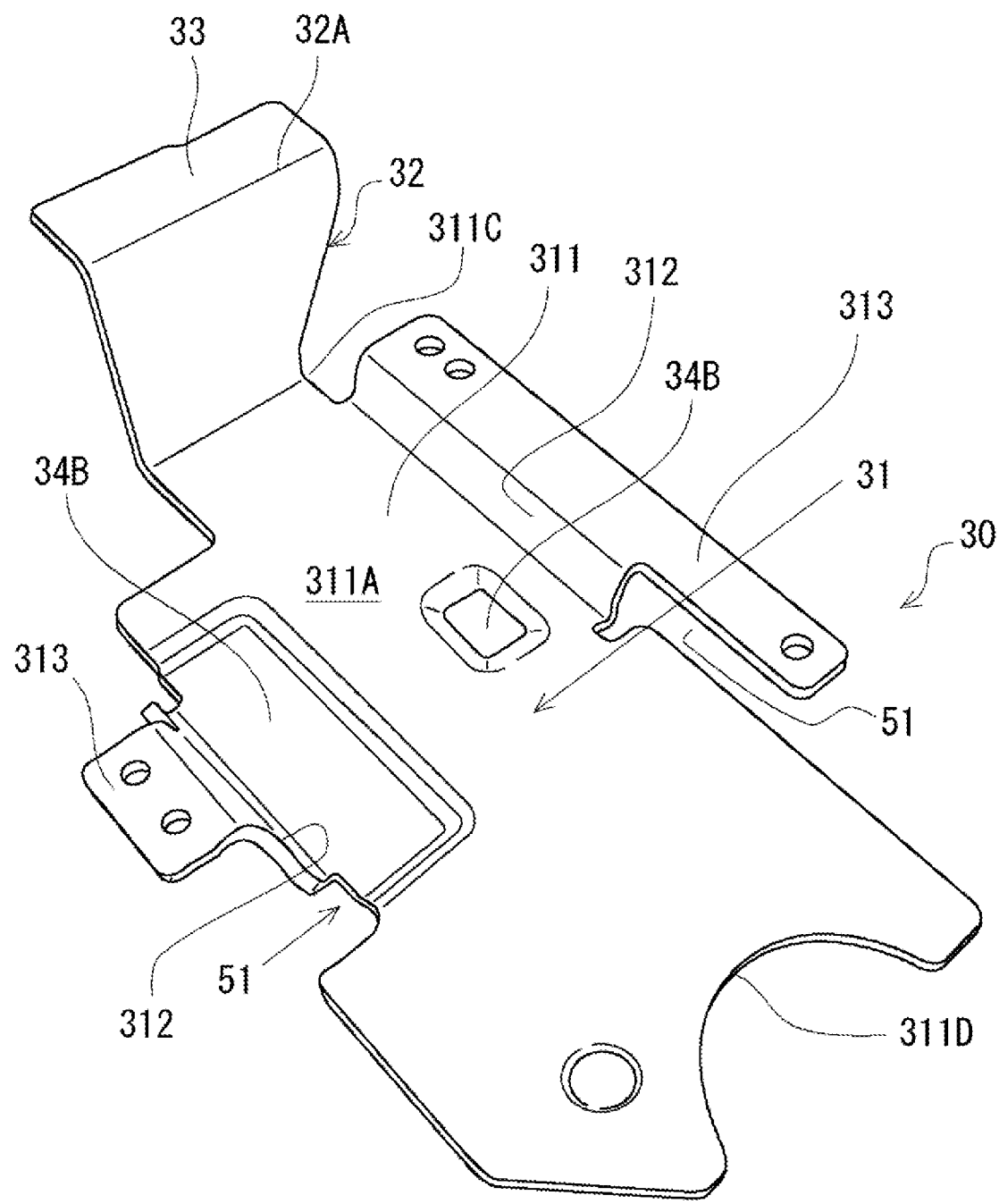
FIG. 4 is a perspective view of a heat sink according to the embodiment 1.
Figure 5:
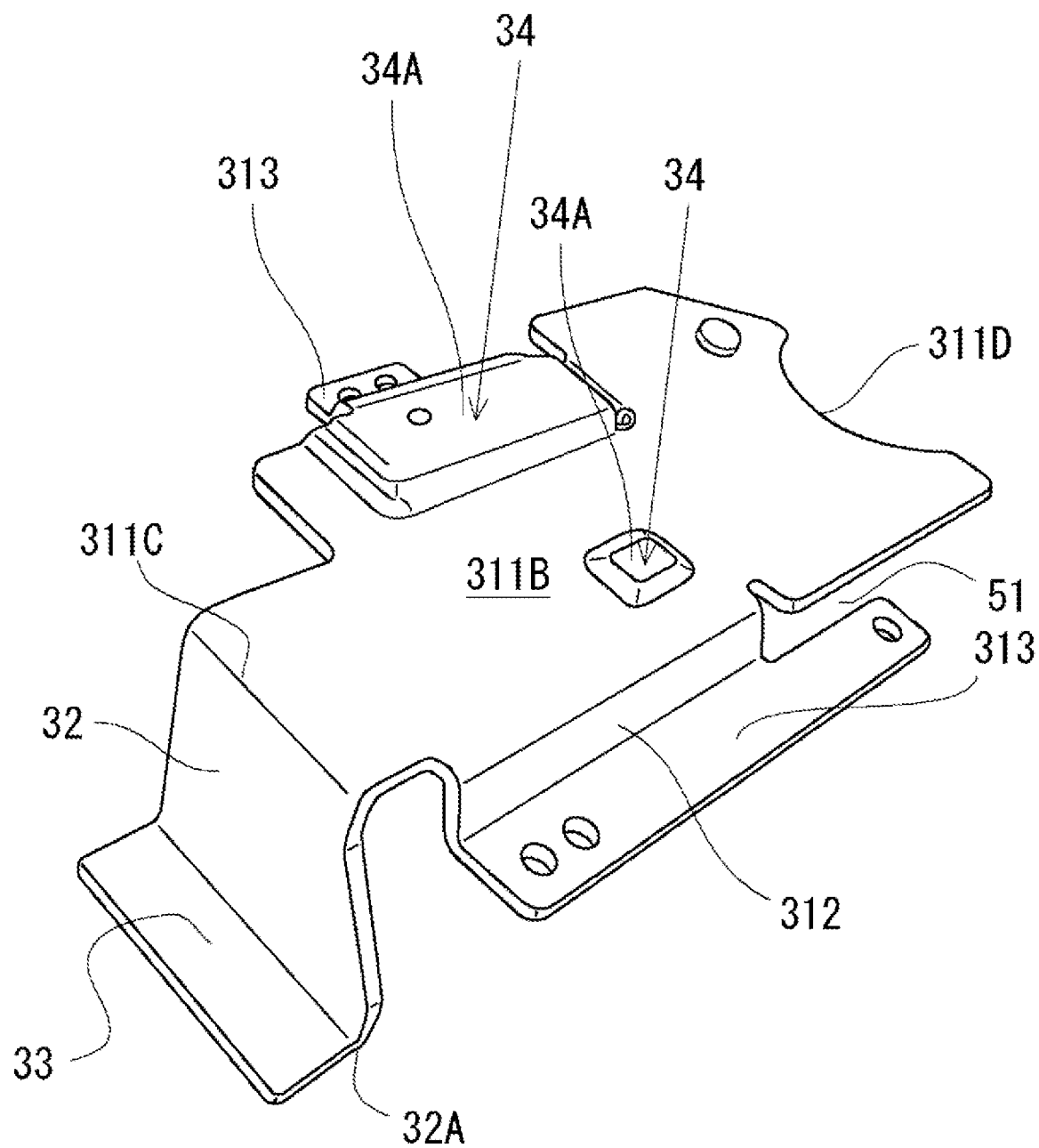
FIG. 5 is a perspective view of the heat sink according to the embodiment 1.
Figure 6:
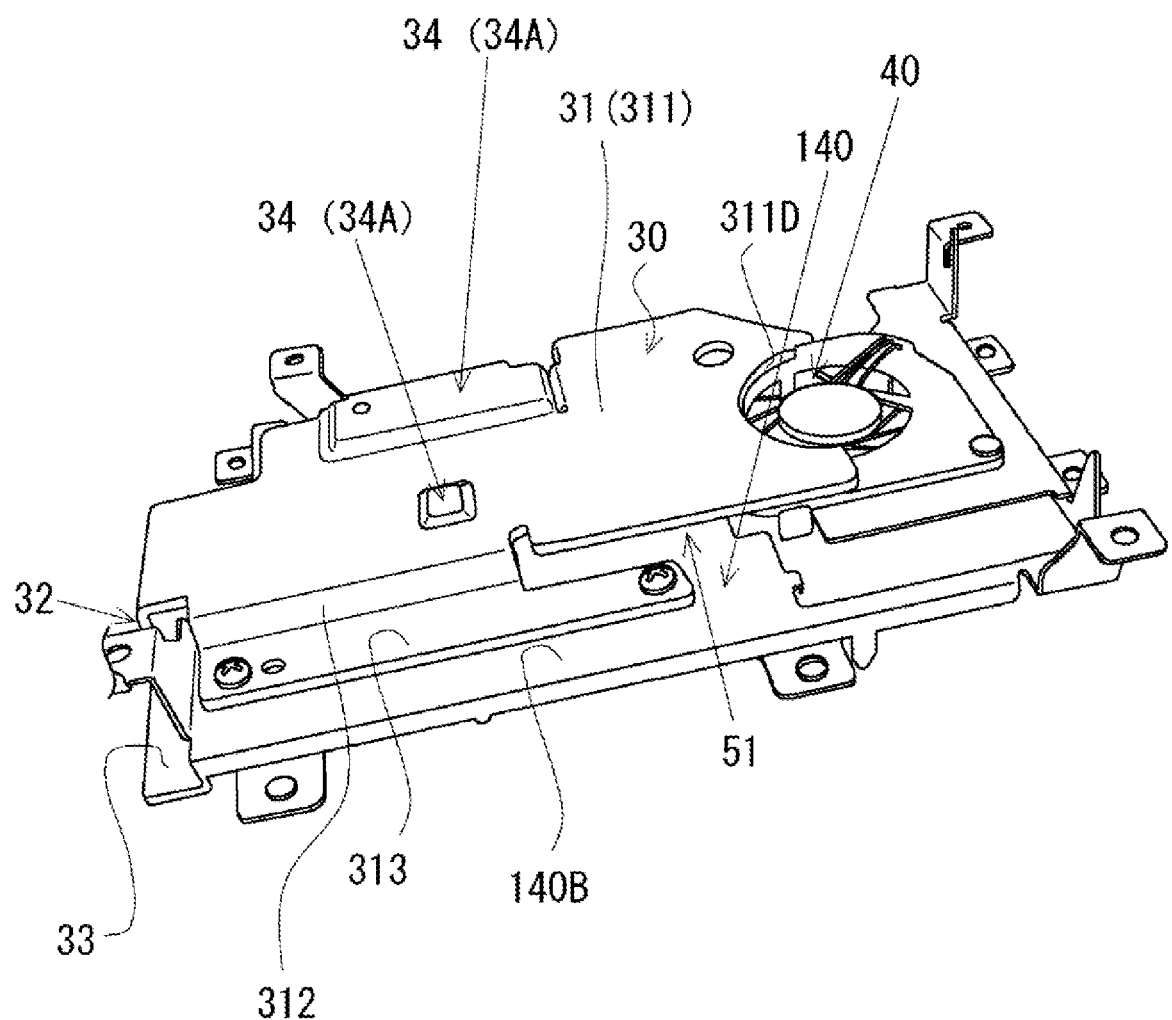
FIG. 6 illustrates a state in which the heat sink is fixed to a lower surface of a substrate holder according to the embodiment 1.
Figure 7:
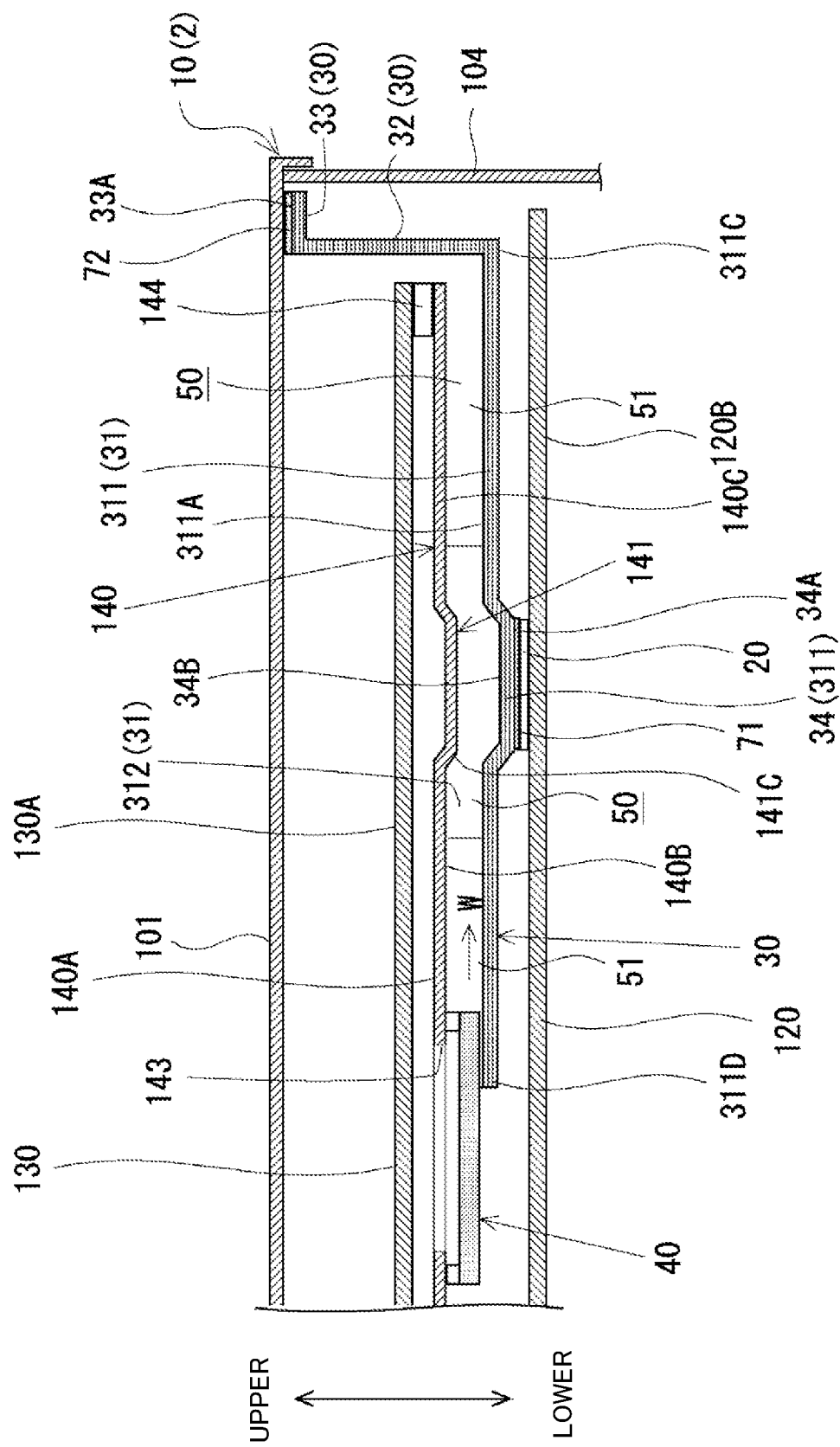
FIG. 7 schematically illustrates a cross-section structure of the substrate holder and the heat sink assembled in the external chassis according to the embodiment 1.

Each of FIG. 4 and FIG. 5 is a perspective view of the heat sink 30 according to the embodiment 1. FIG. 6 illustrates a state in which the heat sink 30 is fixed to a lower surface (back surface) of the substrate holder 140 according to the embodiment 1. FIG. 7 schematically illustrates a cross-section structure of the substrate holder 140 and the heat sink 30 assembled in the external chassis 10 according to the embodiment 1. A reference symbol 140B shown in FIG. 6 and FIG. 7 is the lower surface (back surface) of the substrate holder 140. The heat sink 30 is fixed to the lower surface (back surface) 140B of the substrate holder 140 supporting the third wiring substrate 130 by screwing, etc.

The heat sink 30 is formed, for example, by applying pressing work, etc. to a metal plate having a high heat conductivity, such as aluminum, and includes a first heat dissipation area 31 that extends along the second wiring substrate 120 and the substrate holder 140, a second heat dissipation area 32 that is bent and extends from an end of the first heat dissipation area 31, and a heat dissipation connecting part 33 that is bent and extends from the second heat dissipation area 32, and the like. As illustrated in FIG. 4 and FIG. 5, the first heat dissipation area 31 in the heat sink 30 has a bottom plate 311 having a substantially rectangular shape and a pair of side plates 312 that stands up from both sides of the bottom plate 311. Here, a reference symbol 311A is an upper surface of the bottom plate 311, and a reference symbol 311B is a lower surface of the bottom plate 311. In a state in which the substrate holder 140 having the lower surface (back surface) on which the heat sink 30 is mounted is fixed above the second wiring substrate 120 via the fixing parts 142, the first heat dissipation area 31 of the heat sink 30 extends along the upper surface 120A of the second wiring substrate 120. More specifically, the lower surface 311B of the bottom plate 311 in the first heat dissipation area 31 is arranged substantially parallel to and faces the upper surface 120A of the second wiring substrate 120. On the other hand, the upper surface 311A of the bottom plate 311 in the first heat dissipation area 31 is arranged so as to face the lower surface (back surface) 140B of the substrate holder 140. On an upper end of each of the pair of side plates 312 in the first heat dissipation area 31, a fixing piece 313 for fixing the heat sink 30 to the lower surface (back surface) 140B of the substrate holder 140 is provided so as to be bent from each of the pair of side plates 312. The fixing piece 313 extends substantially parallel to the bottom plate 311 in the first heat dissipation area 31, and a pair of fixing pieces 313 is fixed to the lower surface (back surface) 140B of the substrate holder 140 by screwing, etc., so that the heat sink 30 is fixed to the substrate holder 140 (refer to FIG. 6).

On the bottom plate 311 of the first heat dissipation area 31 in the heat sink 30, a heat receiving connecting part 34 having a convex shape that protrudes from the lower surface 311B relative to a surrounding portion is formed. The heat receiving connecting part 34 has a flat heat receiving surface 34A (refer to FIG. 5). The heat receiving surface 34A of the heat receiving connecting part 34 is placed on an upper surface of the heat generating component 20 mounted on the second wiring substrate 120 so as to receive heat from the heat generating component 20. Since a thermal interface material (TIM) 71 (refer to FIG. 7) excellent in thermal conductivity, such as a heat dissipation grease, a heat dissipation sheet, or the like, is interposed between the heat receiving surface 34A of the heat receiving connecting part 34 and the upper surface of the heat generating component 20, transfer of the heat from the heat generating component 20 to the heat receiving surface 34A of the heat receiving connecting part 34 is promoted.

Here, the heat receiving connecting part 34 formed on the bottom plate 311 in the first heat dissipation area 31 is formed, for example, by pressing and drawing a metal plate constituting the bottom plate 311. In this embodiment, in a position corresponding to the heat receiving connecting part 34 of the upper surface 311A in the bottom plate 311, a concave portion 34B (refer to FIG. 4) that is recessed relative to a surrounding portion is formed. In examples shown in FIG. 4 and FIG. 5, although the heat receiving connecting parts 34 are arranged in two places in the bottom plate 311, a number of the heat receiving connecting parts 34 is not especially limited. The number, size, shape, arrangement position, etc., of the heat receiving connecting part 34 may be appropriately changed according to a number, size, shape, position, etc., of the heat generating components 20 mounted on the second wiring substrate 120 from which heat should be dissipated using the heat sink 30.

As illustrated in FIG. 4 and FIG. 5, the second heat dissipation area 32 in the heat sink 30 extends from a first end 311C that is positioned on one end side of the bottom plate 311 in the first heat dissipation area 31. Hereinafter, an end of the bottom plate 311 opposite to the first end 311C will be referred to as a second end 311D. The second heat dissipation area 32 in the heat sink 30 extends so as to stand upward from the bottom plate 311 similar to the pair of side plates 312. The heat dissipation connecting part 33 is connected to a distal end 32A of the second heat dissipation area 32 in the heat sink 30 that is positioned on an opposite side of a connecting end with the bottom plate 311. The heat dissipation connecting part 33 is bent from an upper end of the second heat dissipation area 32 so as to extend parallel to the bottom plate 311. The heat dissipation connecting part 33 has a flat heat dissipation surface 33A. The heat dissipation surface 33A of the heat dissipation connecting part 33 is connected to the upper surface panel 101 in the external chassis 10 via a thermal interface material 72 (refer to FIG. 7), such as a heat dissipation grease, a heat dissipation sheet, or the like. As described above, although the external chassis 10 may be formed of resins, or the like, in that case, it is desirable that at least a peripheral area connected with the heat dissipation surface 33A should be formed of a material whose heat conductivity is high to some extent, for example, a high thermal conductive resin, or the like, in order to easily dissipate heat from the heat dissipation surface 33A.

Here, as illustrated in FIG. 6, a first air cooling fan 40 is fixed to the lower surface (back surface) 140B of the substrate holder 140 by screwing, etc. Here, the first air cooling fan 40 is provided in a position close to the second end 311D in the first heat dissipation area 31 (bottom plate 311). The first air cooling fan 40 is a so-called centrifugal fan, and a blowing fan capable of blowing air in an in-plane direction orthogonal to a rotating axis. In this embodiment, the rotating axis of the first air cooling fan 40 is oriented in a direction orthogonal to extending directions of the second wiring substrate 120, the substrate holder 140, and the first heat dissipation area 31 (bottom plate 311). Thus, during operation of the first air cooling fan 40, cooling air is generated in a direction along the second wiring substrate 120, the substrate holder 140, and the first heat dissipation area 31 (bottom plate 311). As illustrated in FIG. 3 and FIG. 7, etc., in the position of the substrate holder 140 in which the first air cooling fan 40 is installed, a circular vent hole 143 is formed. The vent hole 143 is formed so as to pass through the substrate holder 140 in a member thickness direction. As a result, when operating the first air cooling fan 40, air that exists above the substrate holder 140 in the interior of the external chassis 10 is smoothly taken into the first air cooling fan 40.

Figure 8:
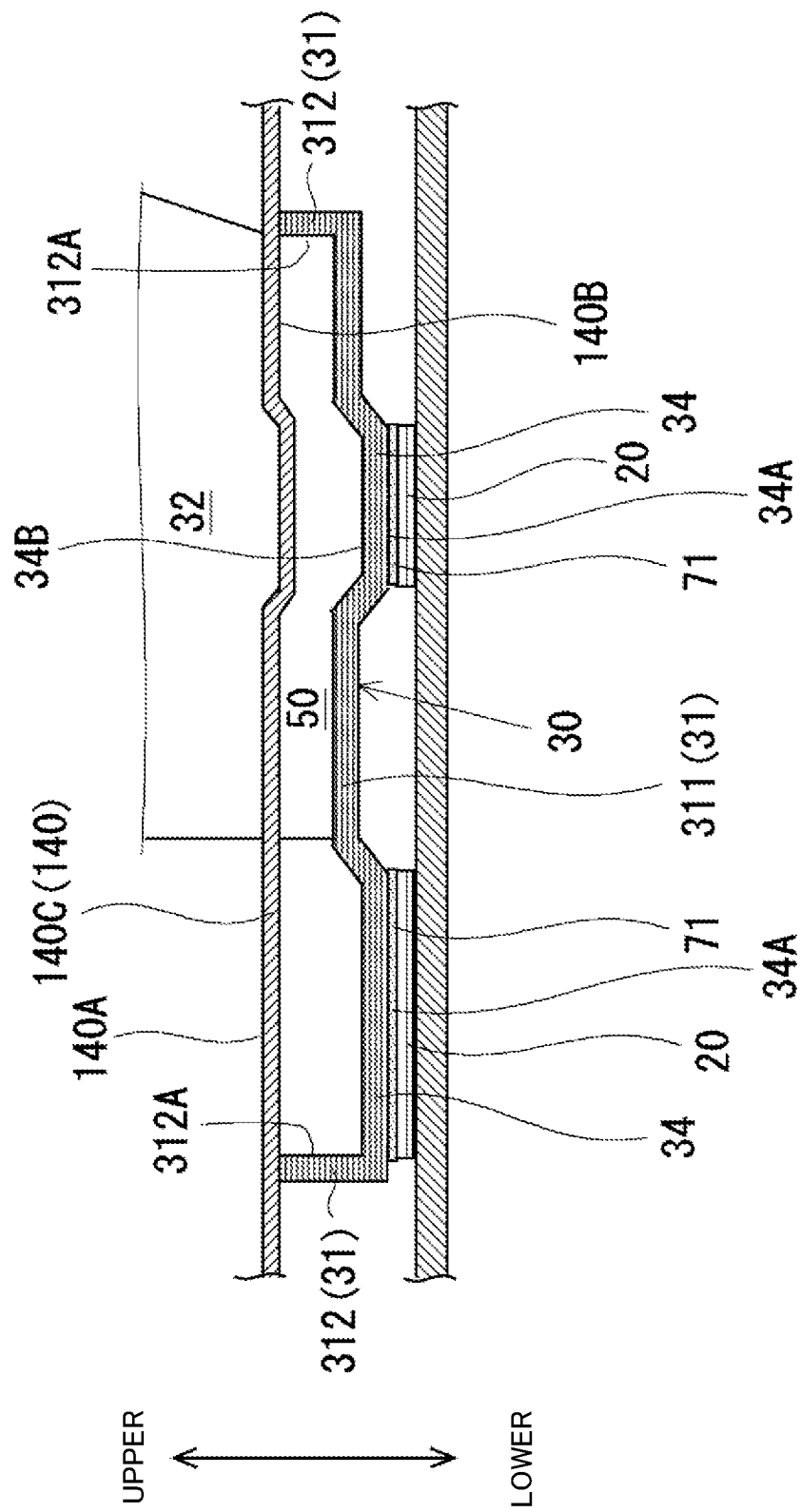
FIG. 8 illustrates a cross-section structure of a duct passage according to the embodiment 1.

In the heat sink 30 configured above, the first heat dissipation area 31 is formed in a duct shape, and a duct passage 50 (refer to FIG. 7) through which cooling air W generated by the first air cooling fan 40 flows is formed inside the first heat dissipation area 31. More specifically, as illustrated in FIG. 6 and FIG. 7, the heat sink 30 is formed in a duct shape by combining the substrate holder 140 as an internal metal chassis plate that is arranged above the first heat dissipation area 31 with the first heat dissipation area 31 in the external chassis 10. Here, the substrate holder 140 corresponds to a substrate holder for supporting the third wiring substrate 130 (wiring substrate in the upper stage) arranged above the second wiring substrate 120 on which the heat generating component 20 is mounted. FIG. 8 illustrates a cross-section structure of the duct passage 50 according to the embodiment 1. As illustrated in FIG. 7 and FIG. 8, the duct passage 50 is defined by the bottom plate 311 in the first heat dissipation area 31, the pair of side plates 312 that stands up from both sides of this bottom plate 311 toward the lower surface (back surface) 140B of the substrate holder 140, and an area (hereinafter, referred to as a "duct upper surface area") 140C of the lower surface (back surface) 140B of the substrate holder 140 that faces the bottom plate 311.

More specifically, in the heat sink 30, the upper surface 311A in the bottom plate 311 of the first heat dissipation area 31 defines a bottom surface of the duct passage 50, and an inner surface 312A of each of the pair of side plates 312 defines both side surfaces of the duct passage 50. The lower surface 140B in the duct upper surface area 140C of the substrate holder 140 defines an upper surface of the duct passage 50. In this way, the duct passage 50 that is surrounded in a duct shape by the first heat dissipation area 31 in the heat sink 30 and the duct upper surface area 140C of the substrate holder 140 is formed so as to extend from the first end 311C in the first heat dissipation area 31 toward the second end 311D. FIG. 8 illustrates a cross-section structure of the duct passage 50 in a direction orthogonal to an extending direction of the duct passage 50.

Here, as illustrated in FIG. 3, an air inlet 103A is formed in the first side surface panel 103 of the external chassis 10. On the other hand, an air outlet 104A is formed in the second side surface panel 104 opposite to the first side surface panel 103, and a second air cooling fan 60 is provided in a position corresponding to the air outlet 104A. The second air cooling fan 60 is a so-called axial fan, and forcibly exhausts air in the external chassis 10 from the air outlet 104A to the outside during operation. As illustrated in FIG. 3, in this embodiment, the air inlet 103A and the air outlet 104A are arranged in positions opposite to each other. The heat sink 30 is arranged in an area sandwiched between the air inlet 103A and the air outlet 104A.

When the first air cooling fan 40 and the second air cooling fan 60 are operated, as indicated by a void arrow shown in FIG. 3, external air of the external chassis 10 is taken into the interior of the external chassis 10 through the air inlet 103A, and exhausted to outside the external chassis 10 through the air outlet 104A on an opposite surface side. As a result, in the interior of the external chassis 10, cooling air for cooing the heat sink 30 that flows from the air inlet 103A toward the air outlet 104A is generated. In this embodiment, the first air cooling fan 40 and the second air cooling fan 60 correspond to an air cooling fan. In FIG. 1, an illustration of the second air cooling fan is omitted.

As described above, the heat dissipation structure in this embodiment includes the heat sink 30 (heat conductive plate) that includes the heat receiving connecting part 34 thermally connected to the heat generating component 20, and the heat dissipation connecting part 33 thermally connected to the upper surface panel 101 of the external chassis 10 as a metal chassis, and the first air cooling fan 40 and the second air cooling fan 60 that generate cooling air for cooling this heat sink 30 in the external chassis 10 (metal chassis). As illustrated in FIG. 7, the first heat dissipation area 31 in the heat sink 30 includes the heat receiving connecting part 34, and extends along the second wiring substrate 120 on which the heat generating component 20 is mounted. The second heat dissipation area 32 is bent from the end of the first heat dissipation area 31 and extends upward. The heat dissipation connecting part 33 of the heat sink 30 is bent from the upper end of the second heat dissipation area 32, extends along the upper surface panel 101 of the external chassis 10, and is surface connected to the upper surface panel 101 via the thermal interface material 72.

The cooling air generated by operation of the first air cooling fan 40 and the second air cooling fan 60 is taken into the duct passage 50 from a side of the second end 311D of the first heat dissipation area 31 in the heat sink 30, and flows toward the first end 311C along the duct passage 50. Assuming that a direction in which the cooling air flows through the duct passage 50 is used as a reference, the side of the second end 311D of the first heat dissipation area 31 is an upstream side of the duct passage 50, and a side of the first end 311C of the first heat dissipation area 31 is a downstream side of the duct passage 50.

Here, the cooling air that flows from an upstream end toward a downstream end of the duct passage 50 flows along a surface of the plate at the first heat dissipation area 31 (the upper surface 311A of the bottom plate 311 and the inner surface 312A of each of the pair of side plates 312). As described above, the heat receiving connecting part 34 is formed in the bottom plate 311 of the first heat dissipation area 31, and the upper surface of the heat generating component 20 is thermally connected to the heat receiving surface 34A of the heat receiving connecting part 34 via the thermal interface material (TIM) 71. The heat received from the heat generating component 20 via the heat receiving connecting part 34 transfers from the heat receiving connecting part 34 to the first heat dissipation area 31, and sequentially transfers from the first heat dissipation area 31 to the second heat dissipation area 32 and the heat dissipation connecting part 33. In this embodiment, since the cooling air flows along the surface of the plate at the first heat dissipation area 31, the first heat dissipation area 31 is cooled by the cooling air. As a result, the heat of the heat generating component 20 received through the heat receiving connecting part 34 is effectively dissipated from the first heat dissipation area 31.

Particularly, according to the heat dissipation structure according to this embodiment, since the first heat dissipation area 31 in the heat sink 30 is formed in a duct shape, the cooling air for air cooling effectively flows along the surface of the plate at the first heat dissipation area 31 without being dispersed. As a result, heat dissipation from the first heat dissipation area 31 in the heat sink 30 is further promoted. Furthermore, according to the heat dissipation structure in this embodiment, the first heat dissipation area 31 in the heat sink 30 is formed in a duct shape by combining the first heat dissipation area 31 with the internal metal chassis plate (e.g., substrate holder 140) that is arranged above the first heat dissipation area 31 in the external chassis 10. In this way, since a duct structure of the heat sink 30 is formed using the internal metal chassis plate (substrate holder 140) that is provided above the heat sink 30, the heat dissipation structure is further compactly formed, and material costs for manufacturing the heat sink 30 are reduced.

In the heat sink 30, since the first heat dissipation area 31, the second heat dissipation area 32, and the heat dissipation connecting part 33 are integrally connected to each other, the heat of the heat generating component 20 received from the heat receiving connecting part 34 sequentially transfers to the first heat dissipation area 31, the second heat dissipation area 32, and the heat dissipation connecting part 33. Here, the heat dissipation surface 33A (refer to FIG. 7) of the heat dissipation connecting part 33 is thermally connected to the upper surface panel 101 in the external chassis 10 via the thermal interface material 72, such as a heat dissipation grease, a heat dissipation sheet, or the like. Therefore, thermal conduction from the heat dissipation connecting part 33 to the upper surface panel 101 allows the heat of the heat dissipation connecting part 33 to be released to the upper surface panel 101 and dissipated from the upper surface panel 101 to the outside. Particularly, the heat dissipation connecting part 33 in this embodiment extends along the upper surface panel 101, and comes into surface contact with the upper surface panel 101. Thus, it is possible to effectively dissipate heat from the heat dissipation connecting part 33 in the heat sink 30 to the upper surface panel 101. As a result, it is possible to improve cooling efficiency of the heat generating component 20.

Furthermore, as illustrated in FIG. 7 and FIG. 8, the second heat dissipation area 32 in the heat sink 30 is bent and extends from the first heat dissipation area 31 so as to cross an advancing direction of the cooling air that flows through the duct passage 50 along the surface of the plate at the first heat dissipation area 31. The second heat dissipation area 32 is arranged so as to receive the cooling air that has flown along the surface of the plate at the first heat dissipation area 31. Here, "the second heat dissipation area 32 extends so as to cross the advancing direction of the cooling air" means that the second heat dissipation area 32 is arranged so as to block the cooling air from advancing. In this way, since the cooling air that has flown along the first heat dissipation area 31 in the heat sink 30 is caused to collide with the second heat dissipation area 32, heat dissipation from the second heat dissipation area 32 is promoted. As a result, it is possible to further improve cooling efficiency of the heat generating component 20. As it is clear from FIG. 4 to FIG. 8, since the second heat dissipation area 32 is formed so as to block only a part of the duct passage 50, the cooling air that has reached the downstream end of the duct passage 50 (first end 311C) passes a side of the second heat dissipation area 32. As a result, the cooling air is smoothly exhausted from the air outlet 104A to the outside. As described above, according to the heat sink 30 according to the heat dissipation structure in this embodiment, it is possible to effectively dissipate heat from the heat generating component using both thermal conduction and air cooling.

The second heat dissipation area 32 in the heat sink 30 extends from the first end 311C of the first heat dissipation area 31 that corresponds to the downstream end of the duct passage 50. According to this, the cooling air flows along the first heat dissipation area 31 (duct passage 50) without disturbing a flow of the cooling air in a middle of the first heat dissipation area 31 (in a middle of the duct passage 50). As a result, it is possible to further improve heat dissipation efficiency from the first heat dissipation area 31.

Figure 9:
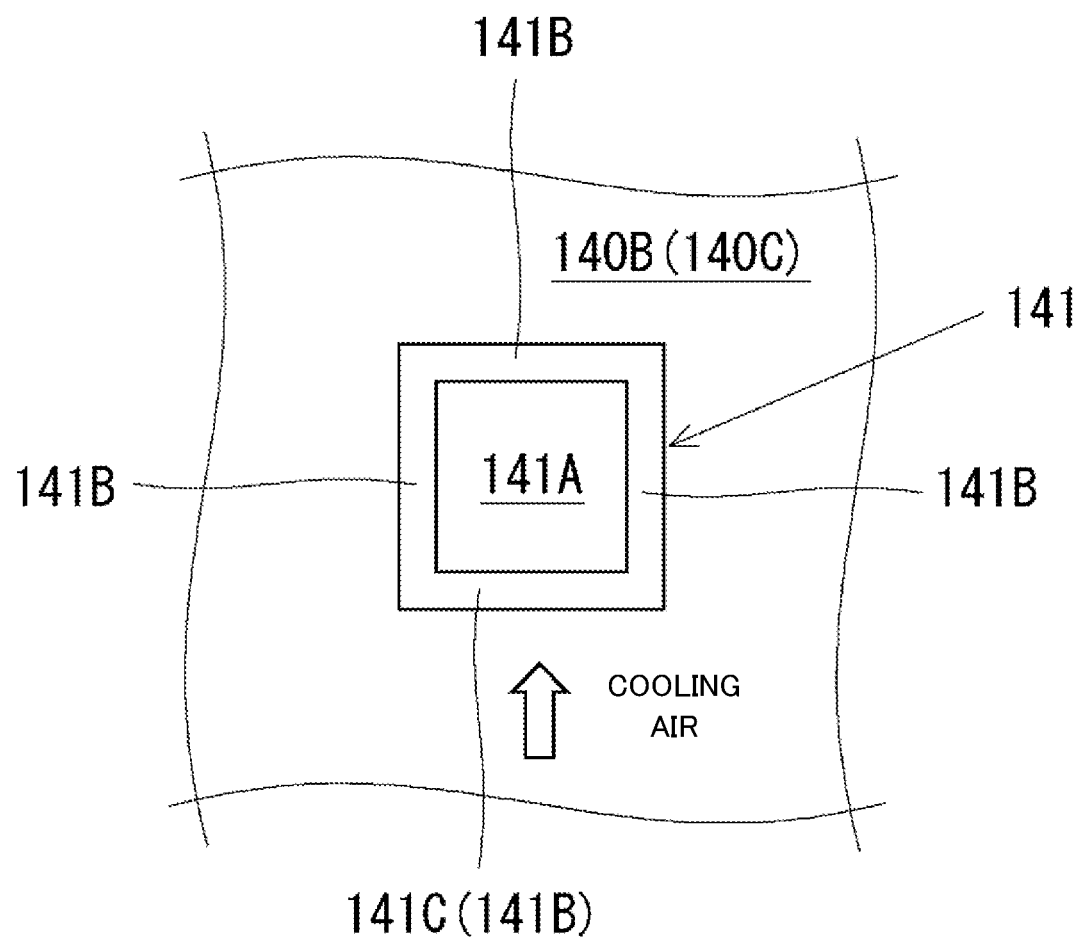
FIG. 9 is a plan view of a guide convex portion provided on a substrate holder according to the embodiment 1.

Furthermore, as illustrated in FIG. 7, a guide convex portion 141 that is a convex portion protruding toward an inside of the duct passage 50 is provided in the lower surface 140B (duct upper surface area 140C) of the substrate holder 140. This guide convex portion 141 is arranged in a position corresponding to the heat receiving connecting part 34 of the first heat dissipation area 31 (bottom plate 311) that is positioned below the guide convex portion 141, that is, above the heat receiving connecting part 34. FIG. 9 is a plan view of the guide convex portion 141 provided on the lower surface 140B (duct upper surface area 140C) of the substrate holder 140 according to the embodiment 1. FIG. 9 illustrates a state in which the guide convex portion 141 is viewed from a side of the duct passage 50.

The guide convex portion 141 is formed, for example, by pressing and drawing a metal plate constituting the substrate holder 140. The guide convex portion 141 has a flat surface 141A having a flat rectangular shape, and an inclined plane 141B connecting each of four sides of the flat surface 141A and the lower surface 140B (duct upper surface area 140C). In an example shown in FIG. 9, an inclined plane of the four inclined planes 141B in the guide convex portion 141 that is positioned on (faces) the upstream side of the duct passage 50 is formed as a guide surface 141C. The guide surface 141C of the guide convex portion 141 is collided with the cooling air that has flown through the duct passage 50 so as to direct the cooling air downward within the duct passage 50, resulting in guiding the cooling air to the heat receiving connecting part 34 that is positioned below the guide convex portion 141. As a result, more cooling air flows near the heat receiving connecting part 34 within the duct passage 50. Thus, the heat receiving connecting part 34 that receives heat directly from the heat generating component 20 is preferentially cooled by the cooling air, so that it is possible to improve cooling efficiency of the heat generating component 20. As described above, the guide convex portion 141 is provided in a position above the heat receiving connecting part 34. Therefore, more cooling air is supplied to the heat receiving connecting part 34, so that it is possible to further improve cooling efficiency of the heat generating component 20.

The guide convex portion 141 may guide the cooling air that flows through the duct passage 50 toward the heat receiving connecting part 34, and a plane shape and position of the guide convex portion 141 may be freely changed. The guide convex portion 141 does not need to be provided in a position corresponding to all of the heat receiving connecting parts 34, may be provided in a position corresponding to a part of the heat receiving connecting parts 34. As a matter of course, the guide convex portion 141 may be set so as to be associated with all of the heat receiving connecting parts 34. The guide surface 141C in the guide convex portion 141 may be arranged on a slightly upstream side from the heat receiving connecting part 34 in the bottom plate 311, and such a guide convex portion 141 is one embodiment of the guide convex portion 141 arranged in a position corresponding to the heat receiving connecting part 34.

As described above, in the position corresponding to the heat receiving connecting part 34 of the upper surface 311A in the bottom plate 311 of the heat sink 30, the concave portion 34B that is recessed relative to the surrounding portion is formed. In this way, when the position corresponding to the heat receiving connecting part 34 of the upper surface 311A in the bottom plate 311 is recessed relative to the surrounding portion, since the guide convex portion 141 is provided above the heat receiving connecting part 34, the heat receiving connecting part 34 is easily exposed to the cooling air. As a result, an effect acquired by providing the guide convex portion 141 becomes more remarkable.

Furthermore, in the heat sink 30 in this embodiment, as illustrated in FIG. 4 to FIG. 6, the pair of side plates 312 that stands up from both sides of the bottom plate 311 in the first heat dissipation area 31 is formed in only parts along both sides of the bottom plate 311. More specifically, duct side openings 51 are formed on both sides of the duct passage 50 on a side of the second end 311D in the first heat dissipation area 31. In this embodiment, the duct side openings 51 of the duct passage 50 are arranged on an upstream end side of the duct passage 50. In this way, since both sides of the duct passage 50 are not completely closed by the pair of side plates 312, and the duct side openings 51 are formed, noise of the first air cooling fan 40 is reduced. The duct side openings 51 may be provided in only one of the pair of side plates 312 that stands up from both sides of the bottom plate 311. In the pair of side plates 312, positions of setting the duct side openings 51 are not especially limited, but, as in this embodiment, the duct side openings 51 are arranged on the upstream end side of the duct passage 50, i.e., near the first air cooling fan 40, so that it is possible to further improve a reduction effect of noise of the first air cooling fan 40.

Although the embodiment of the invention has been described above, the invention is not limited to the above embodiment, and various modifications (such as a combination of the above configurations) may be made by those skilled in the art without departing from the invention as defined in the following claims.

In the above embodiment, although the first heat dissipation area 31 in the heat sink 30 is formed in a duct shape, the invention is not limited to this. For example, in the first heat dissipation area 31, the pair of side plates 312 does not have to stand up from both sides of the bottom plate 311. Even in such an embodiment, since the second heat dissipation area 32 that stands up from the first heat dissipation area 31 (bottom plate 311) receives the cooling air while the cooling air flows along the surface of the first heat dissipation area 31 (bottom plate 311) so as to dissipate heat, heat dissipation from the second heat dissipation area 32 is promoted, and cooling effect is improved. Although the heat dissipation structure in this embodiment includes the first air cooling fan 40 and the second air cooling fan 60, the heat dissipation structure in this embodiment may include only one of the first air cooling fan 40 and the second air cooling fan 60.

In this embodiment, although the duct structure of the heat sink 30 is formed by combining the substrate holder 140 as the internal metal chassis plate that is arranged above the first heat dissipation area 31 with the first heat dissipation area 31, the invention is not limited to this. That is, the duct structure of the heat sink 30 may be formed by combining the first heat dissipation area 31 with other members other than the substrate holder 140. That is, the duct structure of the heat sink 30 may be individually formed. That is, the heat sink 30 may be formed into a duct shape by machining a metal plate constituting the heat sink 30.

The electronic equipment 1, to which the heat dissipation structure according to this embodiment is applied, is not limited to the in-vehicle device shown in FIG. 1, and is surely applied to various types of electronic equipment.

While the invention has been shown and described in detail, the foregoing description is in all aspects illustrative and not restrictive. It is therefore understood that numerous other modifications and variations can be devised without departing from the scope of the invention.

What is claimed is:
1. A heat dissipation structure of a heat generating component that is mounted on a wiring substrate housed in an interior of a chassis of an electronic equipment, the heat dissipation structure comprising:
- a heat conductive plate arranged in the interior of the chassis, the heat conductive plate including a heat receiving connecting part thermally connected to the heat generating component and a heat dissipation connecting part thermally connected to the chassis; and
- an air cooling fan that generates cooling air for cooling the heat conductive plate in the interior of the chassis, wherein
- the heat conductive plate further includes (i) a first heat dissipation area from which heat is dissipated by flowing the cooling air generated by the air cooling fan along a surface of the heat conductive plate and (ii) a second heat dissipation area that is bent and extends from the first heat dissipation area so as to cross an advancing direction of the cooling air that flows along the surface of the heat conductive plate at the first heat dissipation area, and from which heat is dissipated by receiving the cooling air that has flown along the surface of the heat conductive plate at the first heat dissipation area,
- the heat conductive plate includes a first end located adjacent to an air outlet of the chassis, and a second end located adjacent to the air cooling fan,
- the heat conductive plate forms part of a duct passage through which the cooling air flows in the advancing direction from the second end toward the first end before being exhausted through the air outlet of the chassis,
- the duct passage has a width in a direction that crosses the advancing direction of the cooling air,
- the second heat dissipation area is located adjacent to the first end of the heat conductive plate and is thermally connected to the chassis, and
- a first portion of the cooling air that has flown along the surface of the heat conductive plate at the first heat dissipation area collides with the second heat dissipation area and a second portion of the cooling air that has flown along the surface of the heat conductive plate at the first heat dissipation area bypasses the second heat dissipation area before exiting the chassis through the air outlet of the chassis.

2. The heat dissipation structure according to claim 1, wherein
the heat dissipation connecting part is bent and extends from the second heat dissipation area, and is surface connected to the chassis.

3. The heat dissipation structure according to claim 1, wherein
the first heat dissipation area is formed in a duct shape, and a part of the duct passage through which the cooling air flows is formed inside the first heat dissipation area.

4. The heat dissipation structure according to claim 3, wherein
the first heat dissipation area is formed in the duct shape by combining the first heat dissipation area with an internal chassis plate that is arranged above the first heat dissipation area in the interior of the chassis.

5. The heat dissipation structure according to claim 4, wherein
the internal chassis plate is a substrate holder that supports another wiring substrate in an upper stage arranged above the wiring substrate on which the heat generating component is mounted.

6. The heat dissipation structure according to claim 3, wherein
the second heat dissipation area extends from a position corresponding to a downstream end side of the duct passage in the first heat dissipation area.

7. The heat dissipation structure according to claim 1, wherein
a width of the heat conductive plate at the second heat dissipation area is less than the width of the duct passage.

8. A heat dissipation structure of a heat generating component that is mounted on a wiring substrate housed in an interior of a chassis of an electronic equipment, the heat dissipation structure comprising:
- a heat conductive plate arranged in the interior of the chassis, the heat conductive plate including a heat receiving connecting part thermally connected to the heat generating component and a heat dissipation connecting part thermally connected to the chassis; and
- an air cooling fan that generates cooling air for cooling the heat conductive plate in the interior of the chassis, wherein
- the heat conductive plate further includes (i) a first heat dissipation area from which heat is dissipated by flowing the cooling air generated by the air cooling fan along a surface of the heat conductive plate and (ii) a second heat dissipation area that is bent and extends from the first heat dissipation area so as to cross an advancing direction of the cooling air that flows along the surface of the heat conductive plate at the first heat dissipation area, and from which heat is dissipated by receiving the cooling air that has flown along the surface of the heat conductive plate at the first heat dissipation area,
- the first heat dissipation area is formed in a duct shape, and a duct passage through which the cooling air flows is formed inside the first heat dissipation area,
- the first heat dissipation area is formed in the duct shape by combining the first heat dissipation area with an internal chassis plate that is arranged above the first heat dissipation area in the interior of the chassis,
- the first heat dissipation area includes (i) a bottom plate that includes the heat receiving connecting part, faces and extends along the wiring substrate on which the heat generating component is mounted, and defines a bottom surface of the duct passage, and (ii) a pair of side plates that stands up from both side ends of the bottom plate toward the internal chassis plate and defines both side surfaces of the duct passage,
- a duct upper surface area of the internal chassis plate that faces the bottom plate defines an upper surface of the duct passage, and
- a guide convex portion that protrudes toward an inside of the duct passage and has a guide surface for guiding the cooling air to the heat receiving connecting part is formed in the duct upper surface area.

9. The heat dissipation structure according to claim 8, wherein
the guide convex portion is provided in a position above the heat receiving connecting part.

10. The heat dissipation structure according to claim 8, wherein
in a position corresponding to the heat receiving connecting part of the bottom plate, a concave portion that is recessed relative to a surrounding portion is formed.

* * * * *